United States Patent [19]

Schmidt et al.

[11] Patent Number: 4,497,884

[45] Date of Patent: Feb. 5, 1985

[54] METHOD FOR THE PRODUCTION OF A SELF-SUPPORTING MASK

[75] Inventors: Frank Schmidt; Horst Tyrroff, both of Dresden, German Democratic Rep.

[73] Assignee: VEB Zentrum für Forschung Und Technologie Mikroelektronik, Dresden, German Democratic Rep.

[21] Appl. No.: 421,542

[22] Filed: Sep. 22, 1982

[30] Foreign Application Priority Data

Oct. 1, 1981 [DD] German Democratic Rep. ... 233773

[51] Int. Cl.[3] .............................................. G03F 9/00

[52] U.S. Cl. ...................................... 430/5; 430/296; 430/323; 430/324; 427/438; 156/643; 204/11

[58] Field of Search .................. 430/5, 296, 320, 323, 430/324; 204/11; 156/643; 427/431, 438

[56] References Cited

U.S. PATENT DOCUMENTS 4,058,432 11/1977 Schuster-Woldan et al. ...... 156/659

*Primary Examiner*—John E. Kittle
*Assistant Examiner*—José G. Dees
*Attorney, Agent, or Firm*—Jordan and Hamburg

[57] ABSTRACT

The invention relates to a method for the production of a self-supporting spacing mask for a particle radiation-projection system, especially for the selective structuring and/or doping when producing highly integrated circuits.

According to the invention, layers of varying compositions are deposited onto a substrate, structured and then partially or completely removed, until the mask structure which is backed by a stable metal grid is produced on the substrate, whereby a special pattern, made like a nuclear filter with statistically distributed pores is used for grid formation.

5 Claims, No Drawings

METHOD FOR THE PRODUCTION OF A SELF-SUPPORTING MASK

FIELD OF APPLICATION FOR THE INVENTION

The invention concerns a method for the production of a spacing mask for a particle radiation-projection system, for example, for an electron- or ion projector, in particular for the selective structuring and/or type doping in the production of highly integrated circuits.

CHARACTERISTICS OF KNOWN TECHNICAL SOLUTIONS

The ion- or electron projector contains a self-supporting spacing mask, which is partly transparent to the particle radiation, and which is projected onto semiconductor-, conductor-, isolator-, or lacquer layers, according to the image scale of the arrangement, thus enabling a chip-wise selective sensitizing or doping of the layer. Structurizing is made possible by complete area etching or lacquer developing, following the sensitizing.

It is known that stable spacing masks can be obtained if every pattern plane, taking defined length- and width relations to the openings in the mask into consideration, is divided up into at least two masks in a way that no annular closed perforations are produced in the mask. Annular closed structures in the chip are produced by imaging at least two masks, belonging to a pattern plane, onto the corresponding layer. It is further known that a stable spacing mask is obtained, If optionally formed openings therein are backed with a regular basic grid so that grid webs bring about mask stability.

The present state of the art for the production of stable grid masks with an edge length of between 30 and 50 mm, permits the backing of a grid, which has grid webs and square grid holes of each around 5 μm width. An even sensitizing/doping of the chip areas belonging to the backed area is achieved by a four lens exposure. For this, chip and mask are moved with respect to each other following each exposure in such a way that each square opening in the mask exposes a contiguous elementary square on the wafer. If hole- and web widths are equal, the entire grid backed area is contiguously sensitized/doped following the four steps of exposure.

The dimension of digitization of the design as in this case can be limited to the same or manifold four times the edge length of this elementary square. Otherwise grid openings are covered only partially by the structures of the circuit design. During the process of the multiple exposure, unradiated islands appear in the area to be radiated, which can lead to failure of the components. At the present time, by using light-optical methods, a 5 μm raster is governed for the grid. At an image formation scale of the projector of 10:1, 1 μm is possible for the smallest digitization dimension. This corresponds to the integration level of a 1 k-s-RAM.

It is further known that spacing masks can be produced by galvanic deposition of nickel on a substrate. The desired structure of the mask is achieved by using an intentionally structured resist mask of the thickness of ≦2.5 μm on the substrate.

The material thickness necessary for the stability of the mask is achieved, in the case of the pattern plane being divided into at least two spacing masks, by the continuation of the galvanizing process after having reached the lacquer layer thickness, whereby the nickel layer increases evenly laterally and verticaly over the lacquer. However, this method does not enable the realization of a highly integrated circuit technique. In the case of the grid mask, the galvanizing process is interrupted after having reached the lacquer layer thickness; another resist mask of the thickness of ≦2.5 μm applied and the process repeated with the goal of strengthening the grid webs. After etching the substrate a stable spacing mask is the result in both cases.

It is also known that a thick Riston layer (thickness ≦10 μm) can be used to produce a correspondingly thick and stable grid mask. Riston is a multi-layered photo film of a thickness between 3 μm and 100 μm, distributed for example by duPont de Nemours. The intentional structuring of the Riston layer takes place on an auxiliary mask by using reactive ion beam etching, whereby the auxiliary mask itself is structured over a lacquer layer.

It is further known that, for example, a pattern plane of a testing field for a 1 k-s-RAM contains about $10^4$ to $10^5$ dots. The grid structure used in backing the grid mask, however, contains around $10^8$ dots. When producing the grid mask, especially by increasing the fineness of the grid to realize a higher level of integration, the amount of data necessary for the lacquer exposure, increases so strongly that a low error rate production becomes questionable or impossible.

OBJECT OF THE INVENTION

The object of the invention consists in developing a method for the production of a self-supporting spacing mask, whereby, in spite of the required high degree of integration (the digitization measure, for instance, equals 0.2 μm.) and the required fineness of the grid, the process of producing the mask occurs in a simple, economically sound manner.

DESCRIPTION OF THE ESSENCE OF THE INVENTION

The invention is based upon the problem of backing the open area in the spacing mask to be produced with a stable grid, which, in accordance with the desired degree of integration is fine enough, the realization of which, however, requires a pattern which does not exceed the safely processable amount of data of the exposure arrangement.

According to the invention, this problem is solved by using a plastic film, made like a nuclear filter, as a pattern for the grid to be formed. To produce this, a nuclear ray with very low directional dispersion is used. The statistically distributed hole distance and hole diameter are chosen between 0.5 and 2 μm, respectively. This enables radiation of the grid webs on the chip, in connection with an image formation dimension of around 10:1 and the dispersion resolving capability of the projector.

A multiple exposure, when moving mask and wafer with respect to each other, can be eliminated and as a consequence cut grid openings lead only to edge roughness on the chip, determined by the image formation dimension and the sum of hole size and sensitizing/doping width. Since the starting point is an existing pattern, which can be transferred, for instance, by means of electron beam exposure or ion beam exposure onto a large area of the lacquer or a material with ion-negative resist characteristics, onto the carrier substrate to produce the mask galvanically, there is only a slight increase of the amount of data belonging to the pattern structures. To achieve the necessary stability and to determine the structure of the mask, the following process steps have been shown to be particularly advantageous:

(a) depositing a 3 to 10 $\mu$m thick Riston layer on a supporting substrate;

(b) depositing a $SiO_2$ layer on the Riston layer;

(c) depositing an electron beam-negative lacquer layer on the $SiO_2$ layer;

(d) transferring the structure of the pattern, made like a nuclear filter, by electron beam exposure into the lacquer layer;

(e) opening the $SiO_2$ layer by etching, using the negative lacquer as a contact mask (f) removing the negative residual lacquer;

(g) transferring the structure formed by the $SiO_2$ layer into the Riston layer and stripping down to the substrate by the reactive ion beam etching using an oxygen ion beam (h) removing the $SiO_2$ layer;

(i) galvanic processing of nickel onto the support substrate up to the level of the Riston layer;

(j) depositing and structuring a lacquer layer in the positive or negative process with the object of freeing the parts of the nickel filled up Rison film, by which the electron—or ion passage into the semi-conductor material is to be prevented;

(k) continuing the galvanic processing of nickel on the freed parts of the mask until an ion-impervious nickel layer has been produced (l) removing the lacquer residue;

(m) removing the structure;

(n) removing the Riston residue;

(o) clamping the spacing mask into a frame.

In an advantageous variation of the method, in which the supporting grid structure is produced by subsequent etching of an entire, and thus less susceptible to interference, electrolytically deposited layer, the following process steps replace the previously listed process steps (a) to (i):

(a1) depositing a first nickel layer on a substrate, for instance, silicon on aluminium;

(b1) depositing the master on the nickel layer;

(c1) transferring the design structure into the nickel layer by etching, preferably ion beam etching;

(d1) removing the pattern.

In order to achieve a better control of the relationships between the width of the webs and the size of the holes and thus a higher stability of the mask, an additional arrangement in the invention provides the following steps replacing the initially described steps (a) to (i):

(a2) depositing the pattern on the substrate;

(b2) continuing the radiation process with nuclear particles until film islands remain on the substrate with an average diameter of 0.2 to 1.5 $\mu$m;

(c2) galvanic processing of a first nickel layer.

EXAMPLE 1

The invention is more clearly described in the following by means of examples:

The structure of a pattern made like a nuclear filter ("nuclepore-foil"), which has a mean pore distance of around 2 $\mu$m (hole density 2 to $8\cdot10^{7}\,cm^{-2}$) at a satisfactory small fluctuation and a pore width of 0.8 to 1.2 $\mu$m. is transferred onto the uppermost electron beam lacquer layer of a layer series by an electron beam exposure arrangement, having the following structure:

Substrate, preferably of silicon or aluminum, Riston with a thickness of 5 to 10 $\mu$m, $SiO_2$, negative electron beam lacquer. For exposing the electron beam lacquer, the largest matrix dimension of the electron beam exposure arrangement is chosen (at least 10 $\mu$m). The lacquer structure is transferred by plasma-chemical etching into the sputtered $SiO_2$ layer, which serves as an etching mask for the Riston film. The transfer of the structure into the Riston film occurs by means of ion beam etching with the help of oxygen ions. In the thus obtained structure the grid mask is galvanically processed up to the level of the Riston layer. Thereafter the Riston-nickel side of the substrate is coated with electron beam-negative lacquer (thickness 1 to 2 $\mu$m) and the pattern structures transferred into this lacquer with the electron beam exposure arrangement. Following a second galvanizing process a thin nickel layer, enveloping the design structure, has been produced on the grid mask. Subsequently, the substrate is eroded off and the rest of the Riston—as well as the lacquer layer dissolved.

Thus, a stable spacing mask is produced, the optionally formed openings of which are backed with an irregular grid. For the transfer of the pattern structure into the technological layer a single radiation using the projector is carried out. The grid webs are swamped out. The positioning of the pattern structures on the irregular grid is not critical. The resulting edge roughness allows the production of highly integrated circuits. The amount of data, which the electron beam exposure arrangement has to process additionally, because of the grid transfer, does not greatly burden the arrangement.

Of particular advantage is the transfer of the structure of the pattern by ion beams into an ion beam sensitive negative lacquer, since the ion beam exposure allows a higher resolution compared to electron beam exposure. An additional improvement of the method is possible, if instead of using the ion-beam sensitive negative lacquer and the $SiO^2$ etching mask, molybdenum or another material is used, which when exposed to ion beams has the characteristic of a negative resist.

EXAMPLE 2

On a suitable substrate, for instance silicon or aluminum, a first, approximately 5 $\mu$m thick nickel layer is deposited and then the pattern deposited on this by a suitable adhesive, using pressure and heat. Thereafter, the pattern transfer into the nickel layer occurs by ion beam etching at approximately 1 kV and 1 $mA/cm^2$. In this connection, the current density and voltage are to be chosen so that no shrinkage or dissociation of the resist mask results and that an etching ratio relationship of $\ddot{A}_{ni}/\ddot{A}_{foil}\gtrsim 1$ is kept; in special cases $\approx$ 54 nm/min are obtained for $\ddot{A}_{Ni}$.

By adding suitable etching gases, this relationship can be optimized, so that only insignificant mask residue remains and a considerable etching of the substrate is omitted.

After removing the residual resist mask by plasma etching or continued ion beam etching, photo- or electron resist is applied to this "grid structure" and the pattern structure transferred light-optically or by means of electron beam into the lacquer layer. Following the usual development and hardening, the second approximately 5 $\mu$m thick nickel layer is galvanically deposited.

Following the removal of the lacquer and the substrate, the desired self-supporting spacing mask is ready.

EXAMPLE 3

The structure of the pattern described in Example 1 is influenced by the well known manufacturing process for these films that, following the depositing of the foil on a suitable substrate, the holes produced by the nuclear radiation merge and film islands, around 1 $\mu$m in diameter, remain on the substrate. Thereafter the first, approximately 5 $\mu$m thick, nickel layer is galvanically deposited, so that a smooth surface (nickel mesh with foil islands) is produced. Onto this is deposited photo or electron resist, into which the design structure is transferred in the described manner. After the galvanic depositing of the second nickel layer, substrate and film residue are removed according to Example 2.

We claim:

1. A method for the production of a self-supporting spacing mask for reducing particle radiation-projection systems, comprising depositing a sufficiently finely structured nickel layer galvanically on a support substrate, whereby the structure is produced by means of a pattern and subsequently depositing an insulating layer on at least one auxiliary layer, and transferring the pattern structure onto the insulating layer, and galvanizing and separating the nickel layer system from the substrate and isolating the residual insulating layer so that the produced mask may be clamped into a frame, said pattern for producing the mask being in the form of a nuclear filter, said pattern having statistically distributed pores, the diameter P of which in association with the scale of reduction M of the particle radiation projection system yields a value of $P/M=0.05$ to 0.2 $\mu$m and the mean spacing of which is maximally 0.2 $\mu$m.

2. The method according to claim 1:

depositing a first nickel layer onto a substrate, depositing the pattern onto the nickel layer transferring the structure of the pattern into the nickel layer by etching, removing the pattern depositing a photo or electron lacquer layer transferring the pattern structure into the lacquer layer and developing it galvanically depositing a second nickel layer, and removing the lacquer and the substrate.

3. The method according to claim 1, comprising:

depositing the pattern which, so far, does not contain any statistically distributed pores, onto the substrate radiating the pattern by nuclear particles and thereafter developing the pattern, so that film islands having an average diameter of 0.2 . . . 1.5 $\mu$m remain on the substrate galvanically depositing a first nickel layer for producing an irregular grid depositing a photo or electron resist layer transferring the pattern structure into the lacquer layer and developing it for rendering the grid impermeable at determined spots to ions and electrons galvanically depositing a second nickel layer removing lacquer, substrate and foil residues.

4. The method according to claim 2 wherein the first nickel layer is ten times as thick as the second nickel layer.

5. The method according to claim 3 wherein the first nickel layer is ten times as thick as the second nickel layer.

* * * * *